United States Patent [19]
Villa

[11] Patent Number: 5,605,850
[45] Date of Patent: Feb. 25, 1997

[54] METHOD FOR MAKING A LOW-NOISE BIPOLAR TRANSISTOR

[75] Inventor: Flavio Villa, Milan, Italy

[73] Assignee: SGS-Thomson Microelectronics S.r.l., Agrate Brianza, Italy

[21] Appl. No.: 471,084

[22] Filed: Jun. 6, 1995

Related U.S. Application Data

[63] Continuation of Ser. No. 312,472, Sep. 26, 1994.

[30] Foreign Application Priority Data

Sep. 27, 1993 [EP] European Pat. Off. ............. 93830393

[51] Int. Cl.$^6$ ................................................. H01L 21/265
[52] U.S. Cl. ................. 437/31; 437/32; 437/154; 437/917; 148/DIG. 10
[58] Field of Search ................. 437/31, 32, 154, 437/33, 55, 917; 148/DIG. 10, DIG. 96

[56] References Cited

U.S. PATENT DOCUMENTS

| | | | |
|---|---|---|---|
| 3,855,007 | 12/1974 | Polata et al. | 437/31 |
| 3,860,460 | 1/1975 | Olson | 437/154 |
| 3,894,891 | 7/1975 | Magdo et al. | 437/31 |
| 4,047,217 | 9/1977 | McCaffrey et al. | 357/34 |
| 4,239,558 | 12/1980 | Morishita et al. | 437/31 |
| 4,283,236 | 8/1981 | Sirsi | 148/187 |
| 4,956,305 | 9/1990 | Arndt | 437/32 |

FOREIGN PATENT DOCUMENTS

| | | | |
|---|---|---|---|
| 0029548 | 6/1981 | European Pat. Off. | H01L 29/10 |
| 0435331 | 7/1991 | European Pat. Off. | H01L 29/73 |
| 2634618 | 2/1978 | Germany | H01L 29/72 |
| 0023263 | 2/1982 | Japan | 257/557 |
| 0441512 | 1/1968 | Switzerland | 257/557 |

Primary Examiner—Tuan H. Nguyen
Attorney, Agent, or Firm—David V. Carlson; Harry K. Ahn; Seed and Berry LLP

[57] ABSTRACT

A low-noise PNP transistor comprising a cutoff region laterally surrounding the emitter region in the surface portion of the transistor. The cutoff region has such a conductivity is to practically turn off the surface portion of the transistor, so that the transistor operates mainly in the bulk portion. The cutoff region is formed by an N$^+$-type enriched base region arranged between the emitter region and the collector region.

18 Claims, 2 Drawing Sheets

METHOD FOR MAKING A LOW-NOISE BIPOLAR TRANSISTOR

CROSS-REFERENCE TO RELATED APPLICATION

This application is a continuation of U.S. patent application Ser. No. 08/312,472, filed Sep. 26, 1994.

FIELD OF THE INVENTION

The present invention relates to a low-noise bipolar transistor.

BACKGROUND OF THE INVENTION

As known, in electronic devices, the term "noise" indicates a random fluctuation in currents or voltages at the device terminals, and may seriously limit the minimum signal level that can be handled by the device.

The noise in each device is due to various physical causes, some of which have been known for some time. Of particular interest are what are known as "flicker" noise (also indicated 1/f) and "burst" noise, the first of which exists in all and the second in a significant percentage of devices.

Flicker noise is commonly acknowledged to be caused by fluctuations in the number of carriers, due to entrapment of the carriers in surface layers of the device, i.e., due to tunneling at the semiconductor-oxide interface. According to accepted theory, the carriers in the semiconductor may communicate with trap levels at a given distance within the tunnel oxide layer, and remain trapped for some time prior to being re-emitted. In the case of transistors, in particular, flicker noise sources are located at the base-emitter junction.

Flicker noise is especially undesirable in the case of operational amplifier input transistors and audio preamplifiers.

Burst noise, on the other hand, is caused by a sharp variation in current between two or more constant values. Variation frequency may be very low (less than 1 Hz) or high (hundreds of hertz), in which case, burst noise may be confused with a high degree of flicker noise. This type of noise is generally attributed to the presence of defects, metal inclusions and precipitates in the space charge region of the junction; and the fluctuation in current depends on the extent, if any, to which the defect participates in conduction. The fact that burst noise is reduced by deficiency-reducing processes, such as gettering, would appear to bear out this theory.

As is known, for reducing flicker and burst noise it is necessary, for a given collector current $I_C$, to reduce base current $I_B$ and intrinsic base resistance $r_{bb}'$ (below emitter), so as to reduce input noise equivalent current $I_n$ (which is proportional to the square root of base current $I_B$) and noise equivalent voltage $e_n$ (which is proportional to intrinsic base resistance). Solutions have been thus studied for reducing the base current (then increasing transistor gain) and the intrinsic base resistance. Such solutions however present low breakdown voltages, in particular a low collector-to-emitter, short-circuited base, breakdown voltage $BV_{CES}$ (measured with the emitter short-circuited to the base) due to punch-through.

SUMMARY OF THE INVENTION

It is an object of the present invention to provide a transistor designed for reducing the noise with a flexible solution, adaptable to various requirements, and ensuring high breakdown voltages.

In practice, the transistor according to the present invention operates solely in the bulk portion and very little in the surface portion, thus minimizing flicker noise with no reduction in breakdown voltage and, at least in most cases, with no need for additional masks.

DETAILED DESCRIPTION OF THE INVENTION

Preferred, non-limiting embodiments of the present invention will now be described by way of example with reference to the accompanying drawings.

Figure 1:
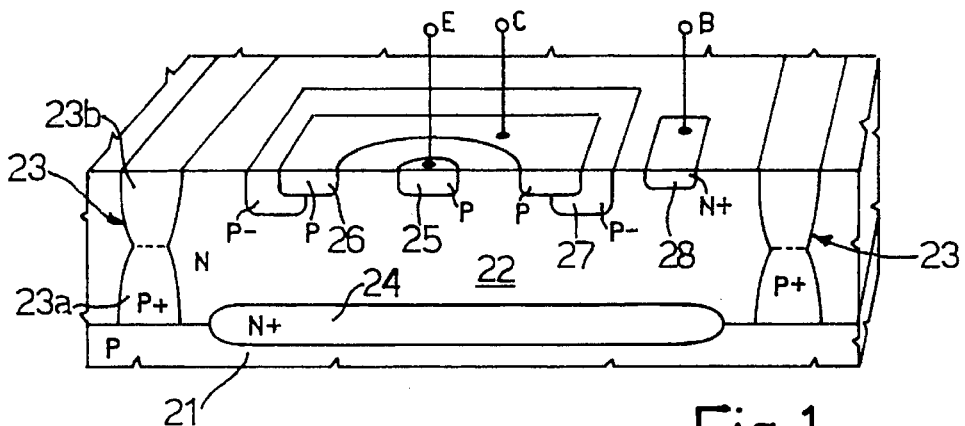
FIG. 1 shows a perspective cross section of a silicon wafer that includes a known PNP-type transistor.

FIG. 1 shows a known PNP transistor with a P-type substrate 21; an N-type epitaxial layer 22; a junction isolation region 23 (formed by a bottom portion 23a and a top portion 23b on account of the two-step fabrication process); a buried layer 24; a P-type emitter region 25; a P-type collector region 26; a P-type ring 27 surrounding collector region 26 (P-well 27); and an $N^+$-type enriched region 28 at the base contact.

The known transistor in FIG. 1 is affected by considerable surface phenomena resulting in flicker noise; and a high total base resistance (including enriched region 28, epitaxial layer 22 and buried layer 24) resulting in less than optimum noise levels.

Figure 2:
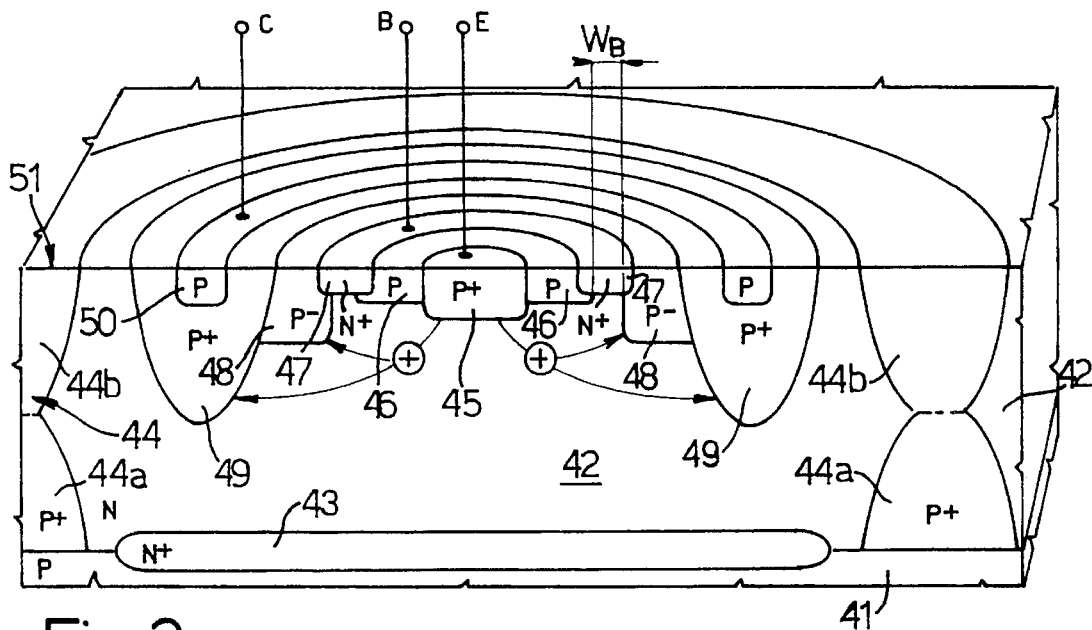
FIG. 2 shows a perspective cross section of a silicon wafer that includes a PNP transistor in accordance with a first embodiment of the present invention.

FIG. 2 shows a first embodiment of a PNP transistor in accordance with the present invention. In this embodiment, the transistor is formed in a silicon wafer including a P-type substrate 41; an N-type epitaxial layer 42; an $N^+$-type buried layer 43; and a $P^+$-type insulation region 44 (formed by a bottom portion 44a and a top portion 44b on account of the two-step fabrication process). Inside epitaxial layer 42 and facing surface 51 of the wafer, there are formed: a $P^+$-type emitter region 45; a P-type annular region 46 surrounding and contiguous with emitter region 45; an $N^+$-type enriched base region 47 surrounding and contiguous with annular region 46; a P-type well region 48 surrounding and contiguous with enriched base region 47; a $P^+$-type deep collector region 49 surrounding and contiguous with well region 48; and a P-type internal collector region 50 inside deep collector region 49, but facing surface 51 of the wafer, for connection to collector contact C. FIG. 2 also shows schematically the base and emitter contacts B and E.

Well region 48 is much less doped than annular region 46, which is less doped than the deep collector region 49. Thus, the well region 48 is much less doped than the deep collector region 49. For example, the well region 48 has a resistance $R_s$ of a few $K\Omega\backslash\square$, whereas the annular region 48 has an $R_s$ of about 100–200 $\Omega\backslash\square$, and the deep collector region 49 has an $R_s$ of about 10 $\Omega\backslash\square$. The enriched base region 47 has instead an $R_s$ of about 2–3 $\Omega\backslash\square$.

In the FIG. 2 transistor, location of the enriched base region 47 between emitter region 45 and collector region 49–50 provides for predominantly bulk operation of the transistor, i.e., in the deep inner portion of the epitaxial layer, and for cutting off the surface portion of the transistor, as shown schematically by the arrows indicating the path of the charge carriers (holes). The fact that the surface portion does not intervene in the transport process provides for reducing flicker noise.

Location of enriched base region 47 close to emitter region 45 also provides for considerably reducing base resistance, thus further reducing flicker noise.

Referring to the transistor of FIG. 2, in the absence of the P-type annular region 46, the emitter region 45 and the enriched base region 47 would form an undesired P+\N+ junction. It is preferred to avoid this type of junction, as these junctions are known to contribute to current leakage. Thus, one purpose of the region 46 is to eliminate such a junction, as is shown. Similarly, the well region 48 prevents current leakage between the regions 47 and 49.

Furthermore the transistor according to FIG. 2 has a higher gain (and thus lower noise than prior art transistor of FIG. 1) by virtue of a small channel width $W_B$ and reduced gain of the parasitic vertical transistor (formed by substrate 41, buried layer 43, epitaxial layer 42 and emitter region 45).

In particular, reduction of the channel width $W_B$ without reducing collector-to-emitter breakdown voltage ($BV_{CES}$) is possible due to the presence of lightly-doped, P-well region 48, which is able to sustain part of the voltage applied to the collector-to-emitter junction.

Reduction of gain of the parasitic transistor is due to the presence of deep collector region 49 which allows emitter region 45 to "see" a sufficient collector area and ensure adequate current collection. By virtue of large area collector region 49, the emitter area may be kept to a minimum, compatible with etching requirements, so reducing parasitic collector current (directed toward the substrate 41) and the gain of the parasitic vertical PNP transistor. Collector region 49 is formed simultaneously with top portion 44b of junction isolation region 44, so that no additional masks are required.

Internal collector region 50 is not essential to operation of the lateral PNP transistor, and is provided solely for ensuring the thickness of the oxide over the collector region, at the point in which the contacts are opened, is equal to that of the oxide over regions 45 and 47.

Furthermore, the transistor according to FIG. 2 has a higher Early voltage $V_A$ than the prior art transistor illustrated in FIG. 1.

The structure of FIG. 2 requires no additional masks as compared with the standard process. In fact, as already stated, deep collector region 49 is formed simultaneously with top portion 44b of junction isolation region 44; internal collector region 50 is equivalent to standard transistor collector region 26 (FIG. 1) and is formed simultaneously with annular region 46; and a P-well mask is already included in the standard process (for forming standard transistor region 27—FIG. 1).

Following P implantation on substrate 41 for forming bottom portion 44a of isolating region 44, and N diffusion for forming buried layer 23, a typical process for fabricating the transistor according to FIG. 2 therefore includes, in sequence: growing epitaxial layer 42; simultaneously forming top portion 44b of isolating region 44 and deep collector region 49; forming well region 48; forming annular region 46; and forming emitter region 45 and enriched base region 47.

Figure 3:
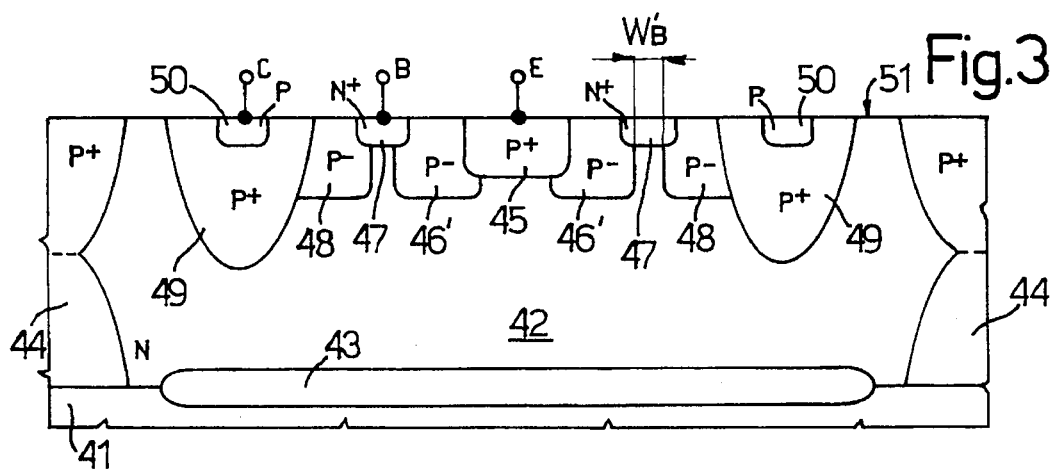
FIGS. 3 to 6 show cross sections of silicon wafers that include respective embodiments of PNP transistors according to the invention.

In the transistor of FIG. 2, channel width $W_B$ between regions 46 and 48 may vary somewhat, due to the distance between annular region 46 and well region 48 possibly varying as a result of misalignment of the respective masks. To minimize this variance, an alternative structure may be employed as shown in FIG, 3, which is identical to that of FIG. 2 (and the corresponding regions of which are therefore indicated using the same numbering system), with the exception of P-type annular region 46, which, in FIG. 3, is replaced by a less heavily doped annular well region 46'. Annular region 46' is formed using the same mask as for well region 48, so that channel width $W_B'$ is unaffected by misalignment of the masks.

In the transistor of FIG. 3, the gain of the parasitic vertical PNP transistor is also reduced by reducing the doping level of region 46' as compared with region 46. The area of annular well region 46' must, however, be minimized, for the purpose, as before, of maintaining the gain of the parasitic transistor as low as possible.

Figure 4:
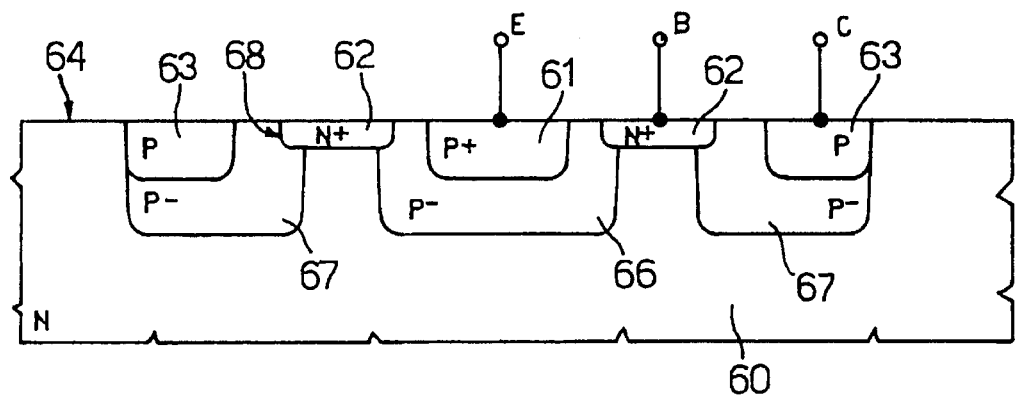
Figure 5:
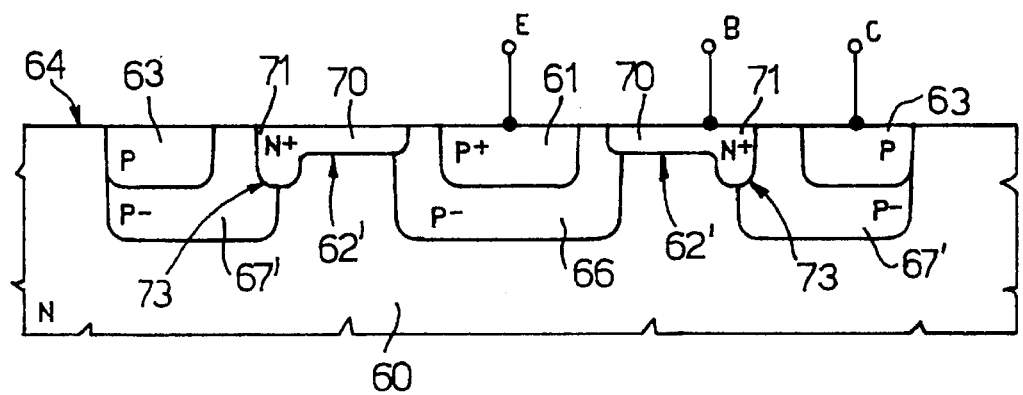
Figure 6:
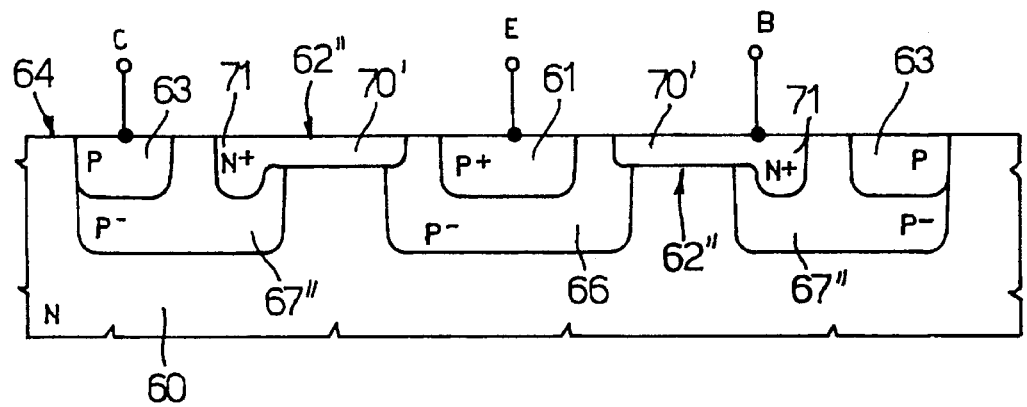

In FIGS. 4 to 6 other possible different embodiments are shown, wherein the silicon epitaxial crystal is subjected to lower stresses than the embodiments according to FIGS. 2 and 3. The embodiments of FIGS. 4 to 6 are characterized by a thin base region; such solutions, limiting the highly doped region to a thin layer, and thus the overall number of doping atoms (and the associated defects), as well as reducing intrinsic base resistance $r_{bb'}$, are less sensitive to burst noise. The presence of a very thin base region allows elimination of the deep collector region, present in transistors according to FIGS. 2 and 3; the emitter regions in fact directly "sees" the collector region, and is no more necessary a deep region to collect charges.

In particular, the structure according to FIG. 4 comprises, in a N-type epitaxial layer 60, a $P^+$-type emitter region 61; an enriched $N^+$-type base region 62, and a P-type collector region 63, all facing surface 64 of the epitaxial layer 60. A tub-like region 66 of P-type laterally and downwardly surrounds emitter region 61 and is contiguous to the internal lateral edge of enriched base region 62; an annular region 67, also of P-type, surrounds collector region 63 downwardly and at the internal lateral edge thereof, till the external lateral edge 68 of enriched base region 62. Although not shown, N- and P-type regions of the structure of FIG. 4 have a circular symmetry, similarly to the embodiment of FIG. 3.

Enriched base region 62 may have a depth comprised between 0.3μ and 0.6μ, typically of 0.5 μm, thus it is very thin as compared with a usual depth of about 1–3 μm of standard base regions. Therefore such a thin layer does not negatively affect the gain of the PNP transistor.

Tub-like region 66 and annular region 67 are formed in the same process step for forming P-wells of the integrated circuit including the present transistor, and thus do not require specific masking or depositing steps.

The structure of FIG. 5 is similar to the structure of FIG. 4, with the exception that the enriched base region 62' comprises a thinner portion 70, similar to region 62 of FIG. 4, and a deeper portion 71, formed at the external edge 73 of enriched base region 62'. Therefore such external edge 73 has a greater curvature radius than edge 68 of base region 62 of FIG. 4. By virtue of such a greater curvature radius of edge 73, the structure of FIG. 5 has a higher breakdown voltage at the base-to-collector junction, i.e., its base-collector junction is able to stand higher voltages than the transistor according to FIG. 4. However, gain of the transistor according to FIG. 5 is about the same as the gain of the transistor according to FIG. 4.

In the structure of FIG. 5, annular region 67' has a greater width than annular region 67 of FIG. 4, and at least partially surrounds edge 73 of base region 62'.

Deeper portion 71 of the enriched base portion is formed in the same step for forming the N⁺ emitter regions of NPN transistors, and therefore portion 71 has the same depth as such N⁺ emitter regions. Furthermore, deeper portion 71 may be formed in the same manufacturing step as emitter regions of NPN transistors and therefore does not require a specific mask.

However, the structure of FIG. 5 has a higher base charge level than the structure of FIG. 4, which could give rise to a reduction of the gain. To minimize such a reduction, the structure of FIG. 6 may be used. The structure of FIG. 6 is similar to the structure of FIG. 5, except for annular region 67" is wider than region 67' of FIG. 5 and completely surrounds deeper portion 71 of enriched base region 62". Furthermore, thinner portion 70' is slightly wider than the corresponding portion 70 of FIG. 5. Therefore the structure of FIG. 6 does not affect base charges as compared with the structure of FIG. 4. Thus, the structure of FIG. 6 has the same gain as the structure of FIG. 4 and is able to withstand the same voltages as the structure of FIG. 5.

To those skilled in the art it will be clear that changes may be made to the transistor and relative fabrication process as described and illustrated herein without, however, departing from the scope of the present invention. In particular, dimensions and shapes of the regions forming the transistor according to the present invention may differ from what shown and described. Additionally, while preferred aspects of the present invention have been described with reference to PNP transistors, the description provided herein will enable those skilled in the art to fabricate analogous NPN transistors.

I claim:

1. A method for making a transistor, comprising:

forming in a semiconductor layer of a first conductivity type having a surface an emitter region of a second conductivity type;

forming in said semiconductor layer a collector region of said second conductivity type that surrounds said emitter region;

forming in said semiconductor layer between said emitter and collector regions a base region of said first conductivity type that surrounds said emitter region and extends a first depth from said surface into said semiconductor layer;

forming an electrically conductive contact on said base region; and forming in said semiconductor layer between said emitter and said base regions an intermediate region of said second conductivity type having a lower dopant concentration than said emitter region.

2. A method for making a transistor, comprising:

forming in a semiconductor layer of a first conductivity type having a surface an emitter region of a second conductivity type;

forming in said semiconductor layer a collector region of said second conductivity type that surrounds said emitter region;

forming in said semiconductor layer between said emitter and collector regions a base region of said first conductivity type that surrounds said emitter region and extends a first depth from said surface into said semiconductor layer;

forming an electrically conductive contact on said base region;

forming in said semiconductor layer between said emitter and said base regions a first intermediate region of said second conductivity type having a lower dopant concentration than said emitter region; and forming in said semiconductor layer between said base region and said collector region a second intermediate region of said second conductivity type having a lower dopant concentration than said emitter region and a second depth substantially greater than said first depth.

3. The method of claim 2 further comprising forming said first and second intermediate regions substantially simultaneously.

4. A method for making a transistor, comprising:

forming in a semiconductor layer of a first conductivity type having a surface an emitter region of a second conductivity type;

forming in said semiconductor layer a collector region of said second conductivity type that surrounds said emitter region;

forming in said semiconductor layer between said emitter and collector regions a base region of said first conductivity type that surrounds said emitter region and extends a first depth from said surface into said semiconductor layer;

forming an electrically conductive contact on said base region; and forming a collector contact region of said second conductivity type in said collector region and contiguous with said surface.

5. A method for making a transistor, comprising:

growing on a substrate having a first conductivity an epitaxial layer having a surface and a second conductivity;

forming in said epitaxial layer an emitter of said first conductivity;

forming in said epitaxial layer around said emitter an annular base having said second conductivity;

forming in said epitaxial layer around said base an annular collector having said first conductivity; and forming in said epitaxial layer between said emitter and said collector an annular intermediate region having said first conductivity and contiguous with said surface.

6. The method of claim 5 wherein said forming an intermediate region further comprises forming between and contiguous with said emitter and said base a first portion of said intermediate region having a lower dopant concentration than said emitter.

7. The method of claim 6 wherein said forming an intermediate region further comprises:

forming between and contiguous with said emitter and said base a first portion of said intermediate region having a lower dopant concentration than said emitter; and forming between and contiguous with said base and said collector a second portion of said intermediate region having a lower dopant concentration than said emitter and a depth substantially greater than that of said base.

8. The method of claim 7 further comprising forming said first and second portions of said intermediate regions with a same mask.

9. The method of claim 5 further comprising forming in said collector an annular contact region having said first conductivity and contiguous with said surface.

10. The method of claim 5 further comprising forming in said epitaxial layer an annular isolating region around said collector and contiguous with said surface.

11. The method of claim 5 wherein said forming said base further comprises forming a shallow base portion along an inner perimeter of said base and a deeper base portion along an outer perimeter of said base.

12. The method of claim 5 further comprising forming an electrical contact on said annular base.

13. The method of claim 5 further comprising:
   forming said base extending a first depth from said surface into said epitaxial layer; and
   forming said intermediate region extending a second depth from said surface into said epitaxial layer such that said second depth is substantially greater than said first depth.

14. A process for fabricating a low-noise PNP bipolar transistor comprising:
   forming an emitter region in a semiconductor layer having a surface portion and a bulk portion located beneath the surface portion;
   forming in the semiconductor layer a collector region that surrounds the emitter region;
   forming in the surface portion of the semiconductor layer between the emitter and collector regions a cutoff region that surrounds the emitter region, and, during operation of the transistor, causes a current between the emitter and collector regions to flow mainly in the bulk portion of the semiconductor layer;
   forming a base contact on the cutoff region;
   forming the semiconductor layer from an N-type material;
   forming as the collector region an annular collector region;
   forming in the semiconductor layer substantially simultaneously with the annular collector region an isolating region that surrounds the annular collector region;
   forming in the surface portion of the semiconductor layer the emitter region from a P-type material; and
   forming as the cutoff region an N-type annular region that surrounds the emitter region.

15. A process as claimed in claim 14, further comprising the steps of:
   forming in the surface portion of the semiconductor layer a P-type intermediate region between and contiguous with the emitter region and the N-type annular region, the intermediate region having a lower doping level than the emitter region; and
   forming in the surface portion of the semiconductor layer a P-type well region between and contiguous with the N-type annular region and the annular collector region.

16. A process as claimed in claim 15 wherein the steps of forming the intermediate region and the wall region are performed simultaneously using a same mask.

17. A process as claimed in claim 15, further comprising a step of forming an annular contact region inside the annular collector region, the steps of forming the annular contact region and the intermediate region being performed simultaneously using a same mask.

18. A method for making a transistor, comprising:
   forming in a semiconductor layer of a first conductivity type having a surface an emitter region of a second conductivity type;
   forming in said semiconductor layer a collector region of said second conductivity type that surrounds said emitter region;
   forming in said semiconductor layer between said emitter and collector regions a base region of said first conductivity type that surrounds said emitter region and extends a first depth from said surface into said semiconductor layer;
   forming an electrically conductive contact on said base region; and
   said collector region extending a second depth from said surface into said semiconductor layer, said second depth substantially greater than said first depth.

* * * * *